(12) United States Patent
Mignot et al.

(10) Patent No.: US 10,607,922 B1
(45) Date of Patent: Mar. 31, 2020

(54) CONTROLLING VIA CRITICAL DIMENSION DURING FABRICATION OF A SEMICONDUCTOR WAFER

(71) Applicant: International Business Machines Corporation, Armonk, NY (US)

(72) Inventors: Yann Mignot, Slingerlands, NY (US); Muthumanickam Sankarapandian, Niskayuna, NY (US); Yongan Xu, Niskayuna, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/170,009

(22) Filed: Oct. 24, 2018

(51) Int. Cl.
*H01L 29/40* (2006.01)
*H01L 23/48* (2006.01)
*H01L 21/768* (2006.01)

(52) U.S. Cl.
CPC ...... *H01L 23/481* (2013.01); *H01L 21/76807* (2013.01); *H01L 21/76831* (2013.01); *H01L 21/76832* (2013.01); *H01L 21/76843* (2013.01)

(58) Field of Classification Search
CPC ............. H01L 23/481; H01L 21/76807; H01L 21/76831; H01L 21/76832; H01L 21/76843
See application file for complete search history.

(56) References Cited

U.S. PATENT DOCUMENTS

| | | | |
|---|---|---|---|
| 5,668,053 A * | 9/1997 | Akimoto | H01L 21/32134 257/E21.309 |
| 5,686,354 A | 11/1997 | Avanzino et al. | |
| 5,747,380 A | 5/1998 | Yu et al. | |
| 5,970,376 A | 10/1999 | Chen | |
| 6,323,121 B1 | 11/2001 | Liu et al. | |
| 6,350,695 B1 | 2/2002 | Tae et al. | |
| 6,867,073 B1 | 3/2005 | Enquist et al. | |
| 7,214,609 B2 | 5/2007 | Jiang et al. | |
| 7,601,641 B1 | 10/2009 | Geiss et al. | |
| 8,114,769 B1 | 2/2012 | Srivastava et al. | |
| 8,119,531 B1 * | 2/2012 | Arnold | H01L 21/0337 257/E21.258 |
| 8,492,279 B2 | 7/2013 | Radwan et al. | |
| 8,921,150 B2 | 12/2014 | Lu et al. | |
| 9,515,075 B1 * | 12/2016 | Sun | H01L 27/11507 |
| 2003/0100176 A1 | 5/2003 | Kim et al. | |
| 2004/0256618 A1 * | 12/2004 | Imai | H01L 27/1214 257/59 |
| 2007/0134917 A1 | 6/2007 | Li et al. | |
| 2012/0187546 A1 | 7/2012 | Akinmade-Yusuff et al. | |
| 2013/0214391 A1 * | 8/2013 | Choi | H01L 21/76816 257/622 |

(Continued)

FOREIGN PATENT DOCUMENTS

CN 101553907 B 8/2012
CN 106469675 A 3/2017

*Primary Examiner* — Phuc T Dang
(74) *Attorney, Agent, or Firm* — Vazken Alexanian; Otterstedt, Wallace & Kammer LLP

(57) ABSTRACT

An Nblock layer is deposited onto a semiconductor substrate that includes metal deposits. A titanium nitride (TiN) layer is deposited directly onto the Nblock layer; an oxide layer is deposited directly onto the TiN layer; and a via hole is formed through the oxide and TiN layer to contact bottom interconnect. The via hole is aligned to one of the metal deposits in the substrate.

14 Claims, 9 Drawing Sheets

(56) References Cited

U.S. PATENT DOCUMENTS

| | | |
|---|---|---|
| 2015/0364420 A1 | 12/2015 | Lin et al. |
| 2016/0086846 A1* | 3/2016 | Lee .................. H01L 21/76843 |
| | | 438/656 |
| 2016/0336429 A1 | 11/2016 | Peng et al. |
| 2017/0294342 A1 | 10/2017 | Lu et al. |

* cited by examiner

CONTROLLING VIA CRITICAL DIMENSION DURING FABRICATION OF A SEMICONDUCTOR WAFER

BACKGROUND

The present invention relates to the electrical, electronic, and computer arts, and more specifically, to fabrication of semiconductor wafers.

Presently, semiconductor wafers are fabricated by deposition and etching of materials on a substrate, usually silicon. Materials are first deposited and etched to form the front end of line (FEOL) circuitry such as individual transistors, then additional layers of material are deposited and etched to provide intermediate circuitry and finally the back end of line (BEOL) interconnects including vias. BEOL interconnects are created using mostly a dual damascene scheme for copper metallization with a TiN hard mask to define the trench and self-aligned via. In some cases, single damascene is used. In both types of damascene process, a nitride cap layer or "Nblock" layer is deposited onto copper circuitry formed in an underlayer, then an oxide layer (often, an ultra-low K layer) is deposited over the Nblock and a hard mask goes on over the oxide layer.

SUMMARY

Principles of the invention provide techniques for controlling via critical dimension with a titanium nitride hard mask.

In one aspect, an exemplary method includes depositing an Nblock layer onto a semiconductor substrate that includes metal deposits; depositing a titanium nitride (TiN) layer directly onto the Nblock layer; depositing an oxide layer directly onto the TiN layer; and forming a partial-depth via hole through the oxide layer to contact the TiN layer, wherein the partial-depth via hole is aligned to one of the metal deposits in the substrate.

In another aspect, a semiconductor wafer includes an underlayer; metal deposits in the underlayer; a sacrificial hardmask layer that covers the underlayer and the metal deposits; a titanium nitride layer that directly covers the sacrificial hardmask layer; an oxide layer that directly covers the titanium nitride layer; and a partial-depth via hole that is etched through the oxide layer to contact the titanium nitride layer that directly underlays the oxide layer, wherein the partial-depth via hole is aligned to one of the metal deposits in the underlayer.

In view of the foregoing, techniques of the present invention can provide substantial beneficial technical effects. For example, one or more embodiments provide one or more of:

Well-defined via diameter (critical dimension or CD) with minimal blowout.

Vertical via with no chamfer (in one or more embodiments, for example, a chamferless via with improved minimum spacing between via and adjacent lower metal line).

These and other features and advantages of the present invention will become apparent from the following detailed description of illustrative embodiments thereof, which is to be read in connection with the accompanying drawings.

DETAILED DESCRIPTION

Figure 1:
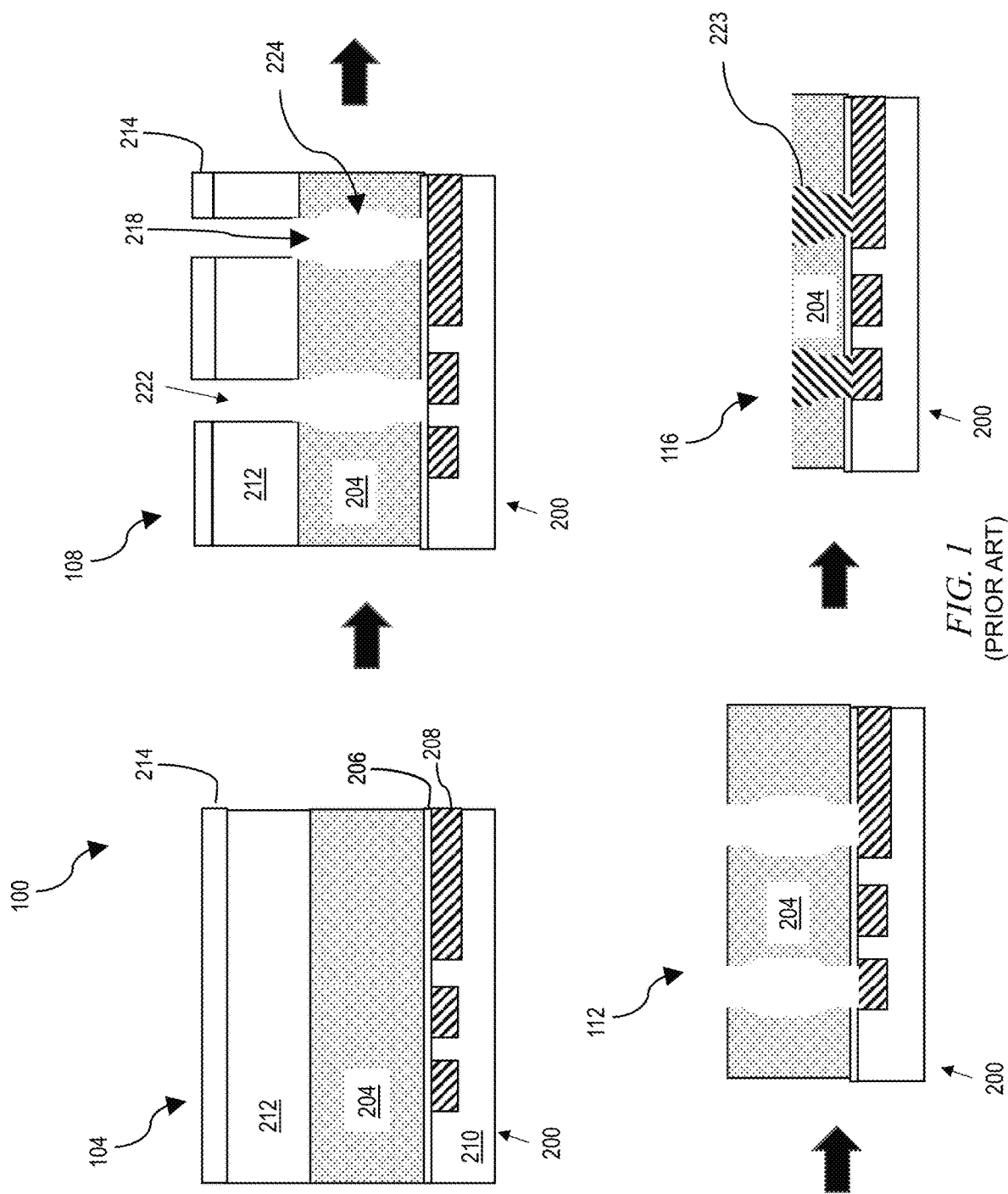
FIG. 1 depicts in side view steps of a process for single damascene via formation with via CD blowout due to over-etching of an oxide layer defining the via.
Figure 2:
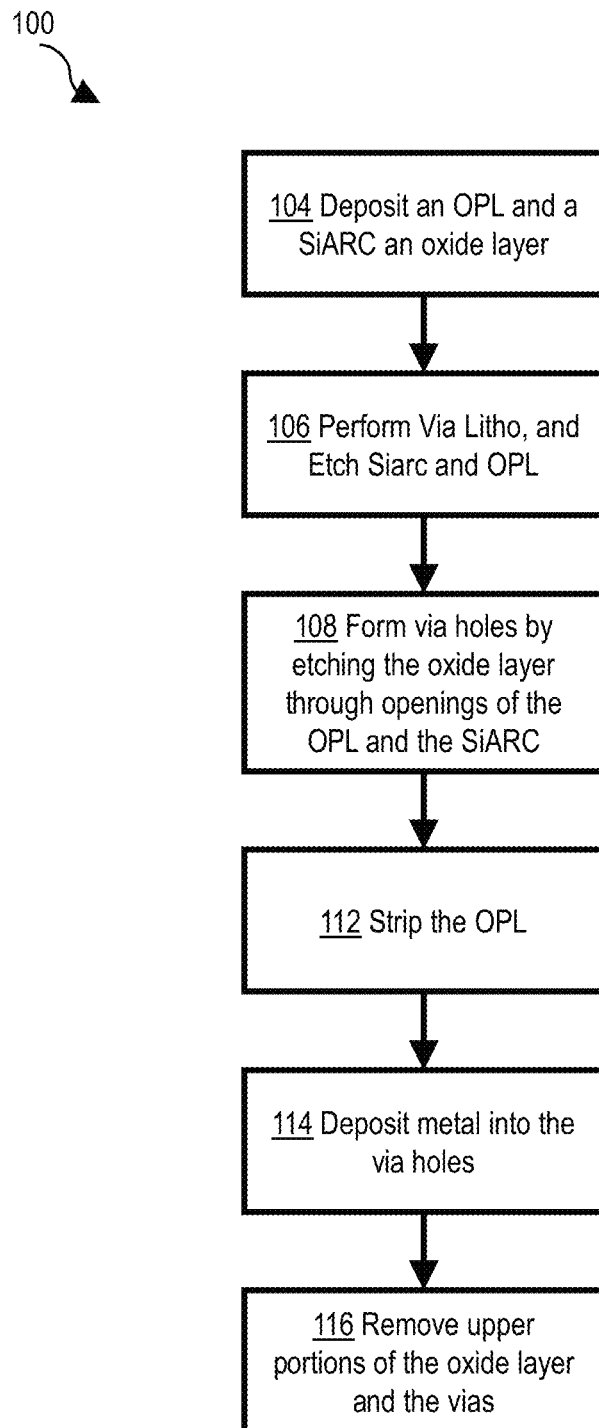
FIG. 2 depicts in flowchart form the steps of FIG. 1.
Figure 3:
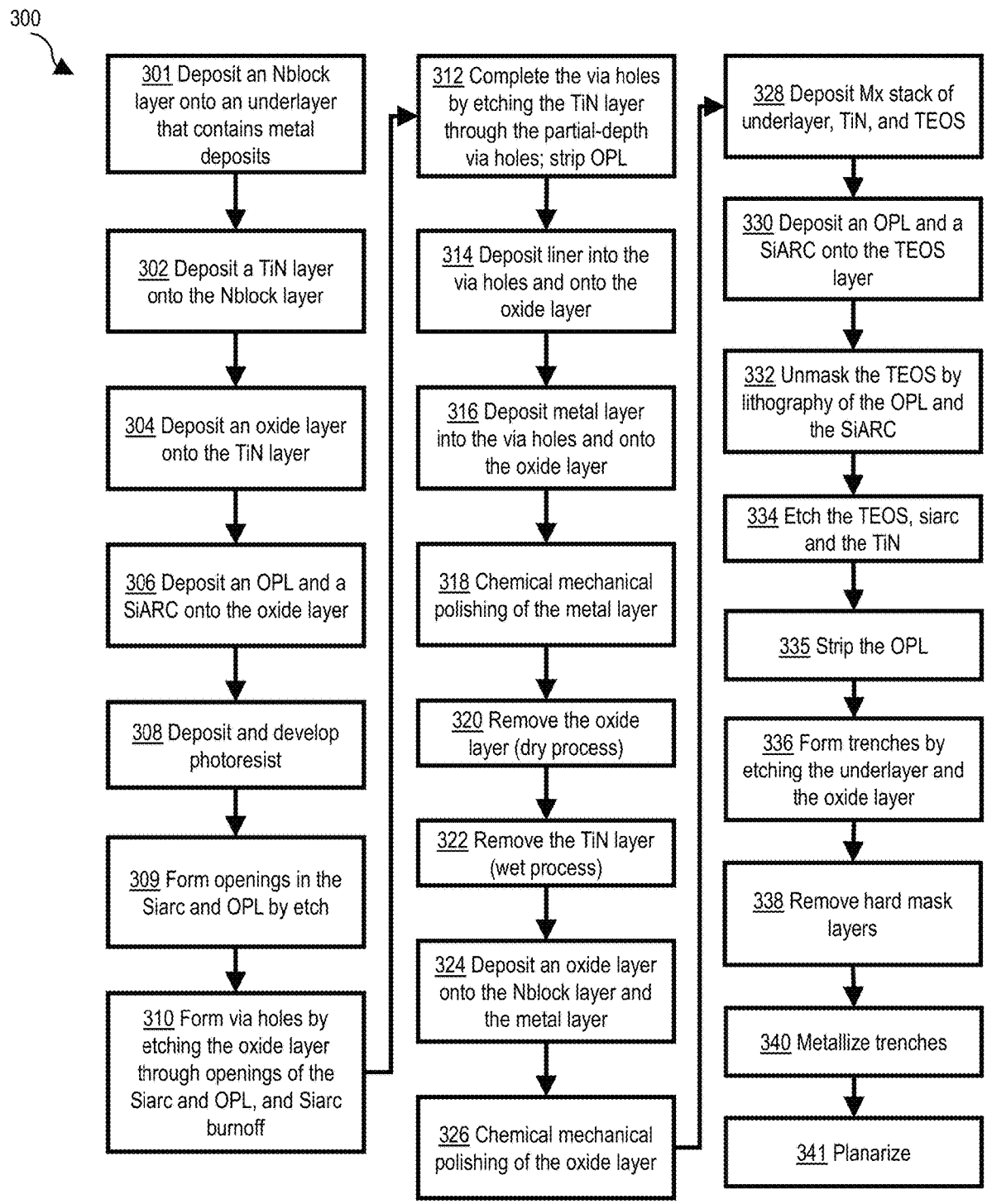
FIG. 3 depicts in flowchart form steps of a process for single damascene via formation using a titanium nitride (TiN) hard mask between an Nblock layer and an oxide layer.

As shown in FIGS. 1 and 2, a single damascene process 100 for forming a via 223 in a semiconductor wafer 200 includes a step 104 of depositing an organic planarization layer (OPL) 212 and a silicon-containing antireflection coating (SiARC) 214 onto an oxide layer 204, which overlays an Nblock layer 206, a copper layer 208, and an underlayer (e.g., silicon substrate) 210. At 106, the process 100 further includes performing via lithography on a photoresist (not shown), etching the SiARC 214 and the OPL 212, then at 108 forming holes 218 for vias 223 by etching the oxide layer 204 through openings 222 of the SiARC 214 and the OPL 212. Typically the oxide layer 204 is etched using carbon fluoride ($CF_4$) dry etch, however, other dry chemistries like $C_4F_8$, $CH_2F_2$, $C_4F_6$ or any combination of them can be used to etch the Oxide layers. During the relatively long etch time required to get to the bottom of the oxide layer 204, $CF_4$ collects at and backscatters from the bottoms of the holes 218, thereby etching sideways as well as vertically. The phenomenon of sideways etching, which enlarges the critical dimension (diameter, CD) of each via hole 218, as shown at 224 in FIG. 1, is known as "blowout".

During the etching of layer 204, Siarc 214 is removed. After etching the oxide layer 204, at 112 the OPL 212 is stripped, for example using $N_2/H_2$, $He/HBr/O_2$, $O_2$, $SO_2$, or $CO/CO_2$ chemistry. Typically, the OPL stripping chemistry also is aggressive against the oxide layer 204, and exacerbates the blowout problem. Then at 114 copper or other metal is deposited into the via holes 218 to form the vias 223. At 116, chemical mechanical polishing is used to remove upper portions of the oxide layer 204 and of the vias 223. The remnants of the vias 223 display a bowed or semi-elliptical cross section that is a feature of the blowout phenomenon.

Referring now to FIGS. 3 and 4A-4E, an aspect of the invention is that via hole blowout can be mitigated by depositing a layer of titanium nitride (TiN) below an oxide layer and forming completed via holes in the TiN layer, using a $Cl_2$ dry etch or other dry chemistry that is selective to the oxide layer, after first forming the via holes through the oxide layer, using a $CF_4$ dry etch or other dry chemistry that is antagonistic to the oxide layer.

Accordingly, a process 300 for controlling via critical dimension with a titanium nitride hard mask is performed on a semiconductor wafer 400. The process 300 includes, at 301, depositing an Nblock layer 404 onto an underlayer 408 that contains metal (e.g., copper) deposits 406, then at 302, depositing a TiN layer 402 onto the Nblock layer 404. At 304, the process 300 further includes depositing an oxide layer 410 (e.g., tetraethylorthosilicate or "TEOS") onto the TiN layer 402. At 306, an OPL 412 and a SiARC 414 are deposited onto the oxide layer 410.

Figure 4A:
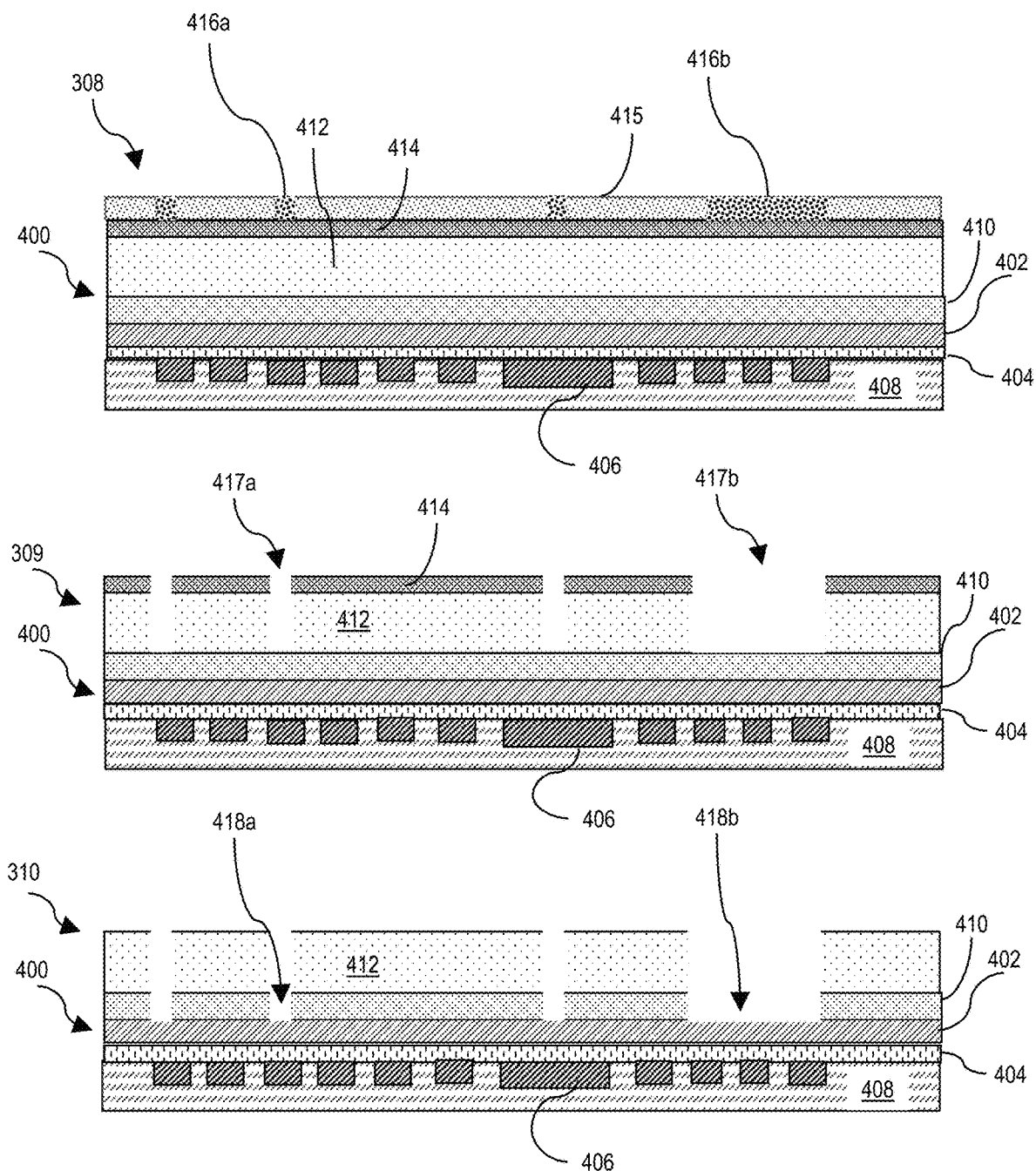
FIGS. 4A-4E depict in side view the steps of FIG. 3.

Then, referring specifically to FIG. 4A, at 308 a photoresist 415 is deposited and partially developed. In a subsequent step (not shown), the developed portions 416a, 416b of the photoresist 415 are removed by lithography to uncover portions of the SiARC 414. The patterning flow could be done by a variety of sequences such as direct litho patterning, litho-etch-litho-etch (LELE), self-aligned double patterning (SADP), or other optical or EUV lithographic methods. At 309, the uncovered portions of the SiARC 414 and OPL 412 below are removed to form openings 417a, 417b that will respectively result in a single via and a via bar. During removal of the OPL 412, the remaining photoresist 415 also is removed. At 310, partial-depth via holes 418a, 418b are formed by etching the oxide layer 410 through the openings 417a, 417b of the SiARC 414 and the OPL 412, using $CF_4$ or other dry process that is antagonistic to the oxide layer 410. The process used for etching the oxide layer is selective to the TiN 402, as well. In the same process, the SiARC is stripped; i.e., in one or more embodiments, the SiARC 414 and the TEOS 410 are removed together using a dry process.

Figure 4B:
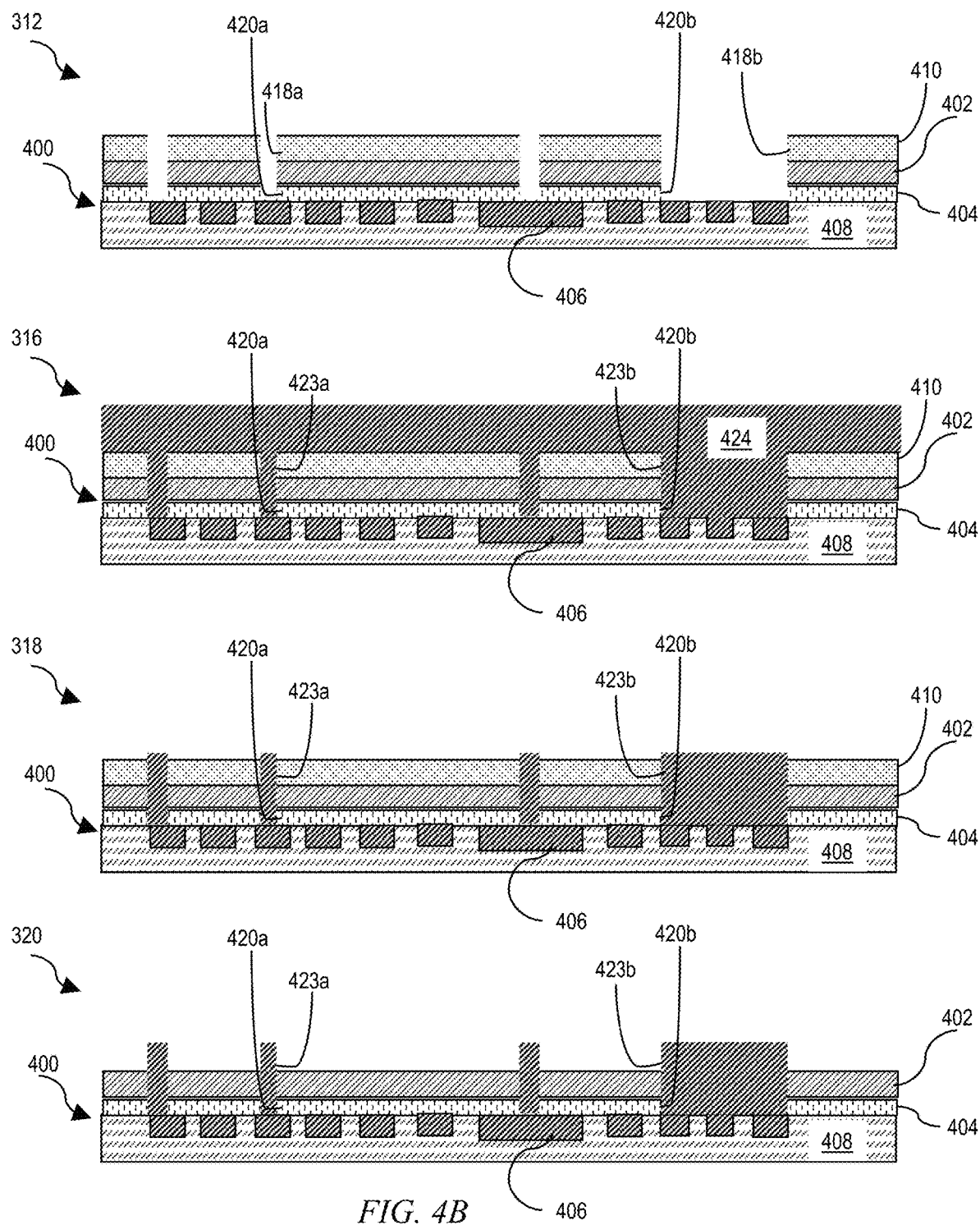

Referring now to FIG. 4B, at 312, complete the via holes 420a, 420b by etching the TiN layer 402 through the partial-depth via holes 418a, 418b, using $Cl_2$ or other dry process that is selective to the oxide 410. Then etch the Nblock Cap layer using a $CF_4$ or $CH_3F$ chemistry that is selective to the TiN 402 and TEOS 410 and underlayers 406 and 408. Then OPL is stripped. Indeed, in one or more embodiments, because of the transition of TEOS→TIN→Nblock, the Etch chemistry is different and has enough selectivity to "stop" precisely on the etch layer without damaging the layer below.

Accordingly, the critical dimension (CD) of the via holes 420 is now defined by the TiN opening. The problem of blowout is mitigated; thus, the CD of the via holes 420 is substantially constant, i.e. remains within 2 nm of an average value throughout the oxide layer 410 and the TiN layer 402.

Optionally, at 314 (shown only in FIG. 3), a liner 422 is deposited to improve adhesion between the underlayer 408 and a subsequent metal layer 424. The liner can be omitted if a metal other than copper is used. Still referring to FIG. 4B, at 316, single via 423a and via bar (multi-via) 423b are formed by depositing the metal layer 424 into the via holes 420a, 420b and over the oxide layer 410. The metal layer 424 can be copper or other metal such as cobalt, Tungsten, Aluminum, Tantalum or ruthenium. At 318, remove part of the metal layer 424 by chemical mechanical polishing and at 320 remove all of the oxide layer 410 by $CF_4$ etch or similar dry process.

Figure 4C:
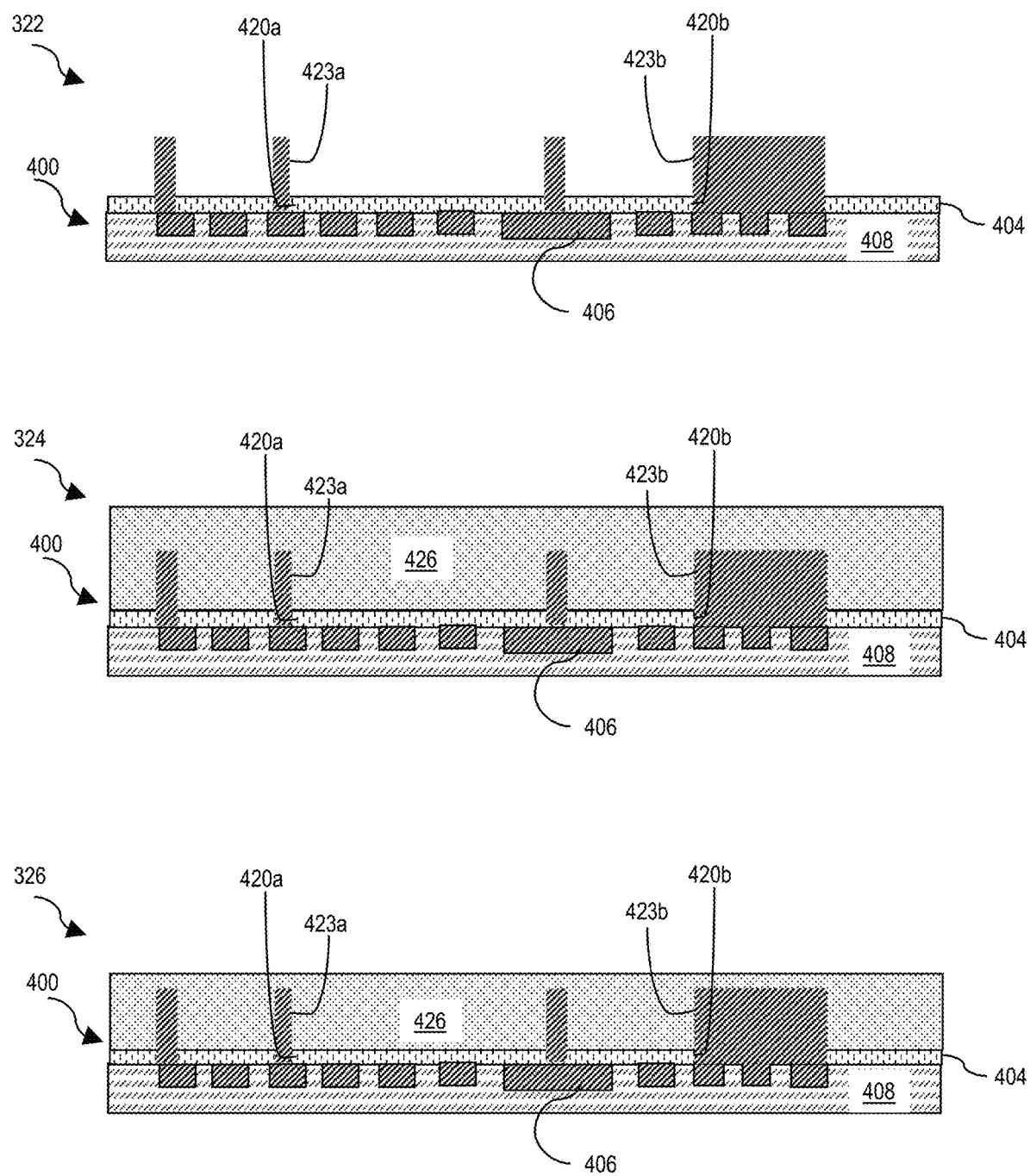

Referring now to FIG. 4C, at 322, remove the TiN layer 402 by a wet process, e.g., a TiN-selective wet chemistry that includes an oxidizing agent, metal protection agent, and a pH stabilizer in water or solvent mixtures. Suitable wet chemistries comprise a quaternary ammonium hydroxide, hydrogen peroxide, or benzotriazole passivation agents. For example, TiN wet removal chemistry formulation includes an oxidizing agent (preferably hydrogen peroxide) and a pH controlling agent in an aqueous solution, in addition to a sequestering agent and a metal protection agent. The wet removal process is done typically at temperature ranges of 40-65 degrees Celsius. The pH of the formulation may be adjusted to a range of 7 to about 14 using a base (typically a quaternary ammonium salt such as tetramethyl ammonium hydroxide or tetraethyl ammonium hydroxide). The sequestering agents can be amines and amino acids. The preferred sequestering agents are 1,2-cyclohexanediamine-N,N,N',N'-tetraacetic acid (CDTA), ethyenediaminetetraacetic acid (EDTA) and diethylenetriaaminopentaacetic acid (DTPA). The metal protectants are in general, hetero-organic inhibitors such as azoles or thiols, preferably benzotriazoles (BTA).

Then at 324, deposit a subsequent oxide layer 426 over the Nblock layer 404 and adjacent to the metal vias 423, and continue depositing the oxide layer 426 to cover the vias 423. At 326, perform chemical mechanical polishing on the subsequent oxide layer 426. Leave a thickness of oxide layer 426 sufficient for trench depth, approximately 30 to 80 nm.

Figure 4D:
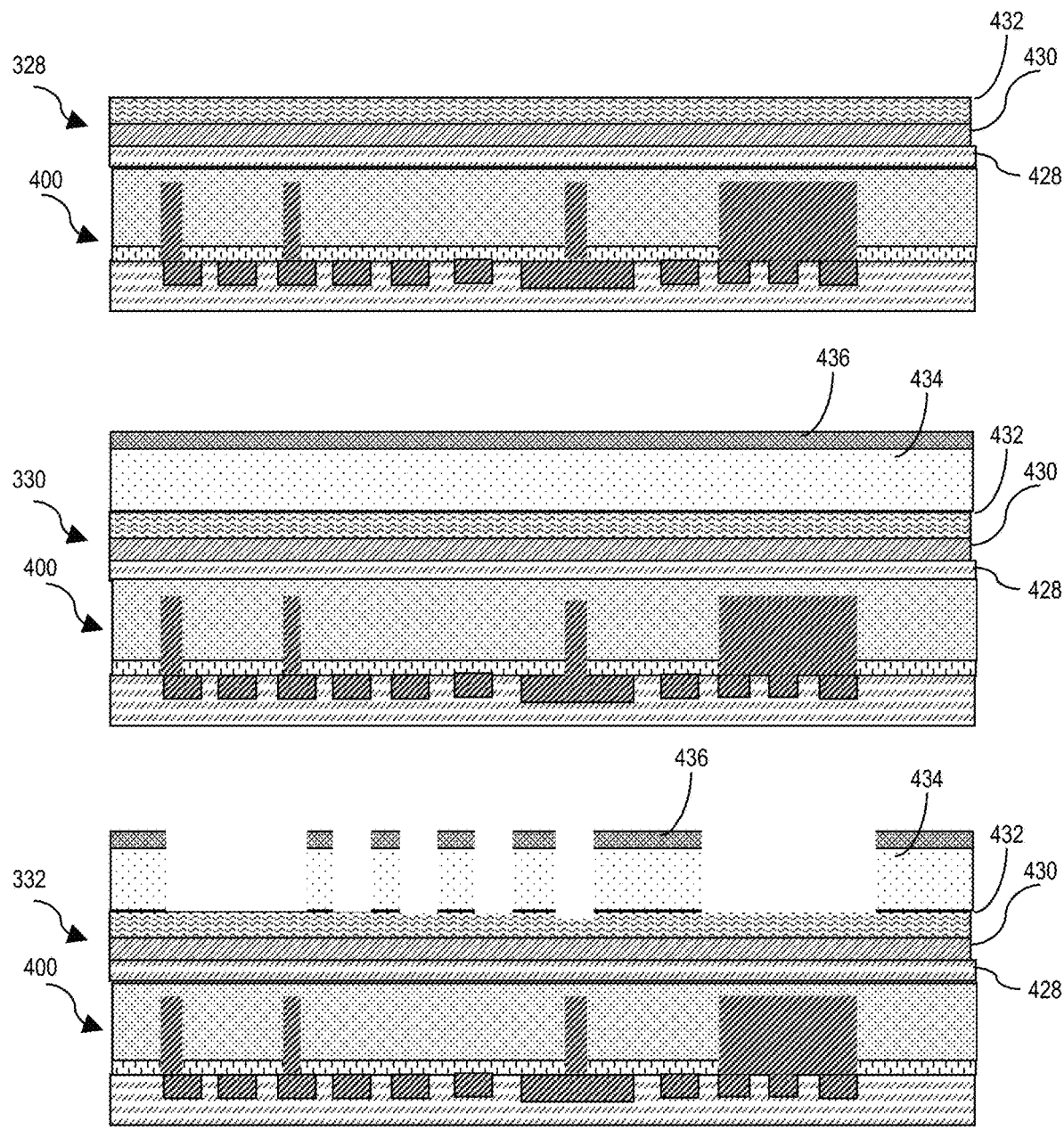
Figure 4E:
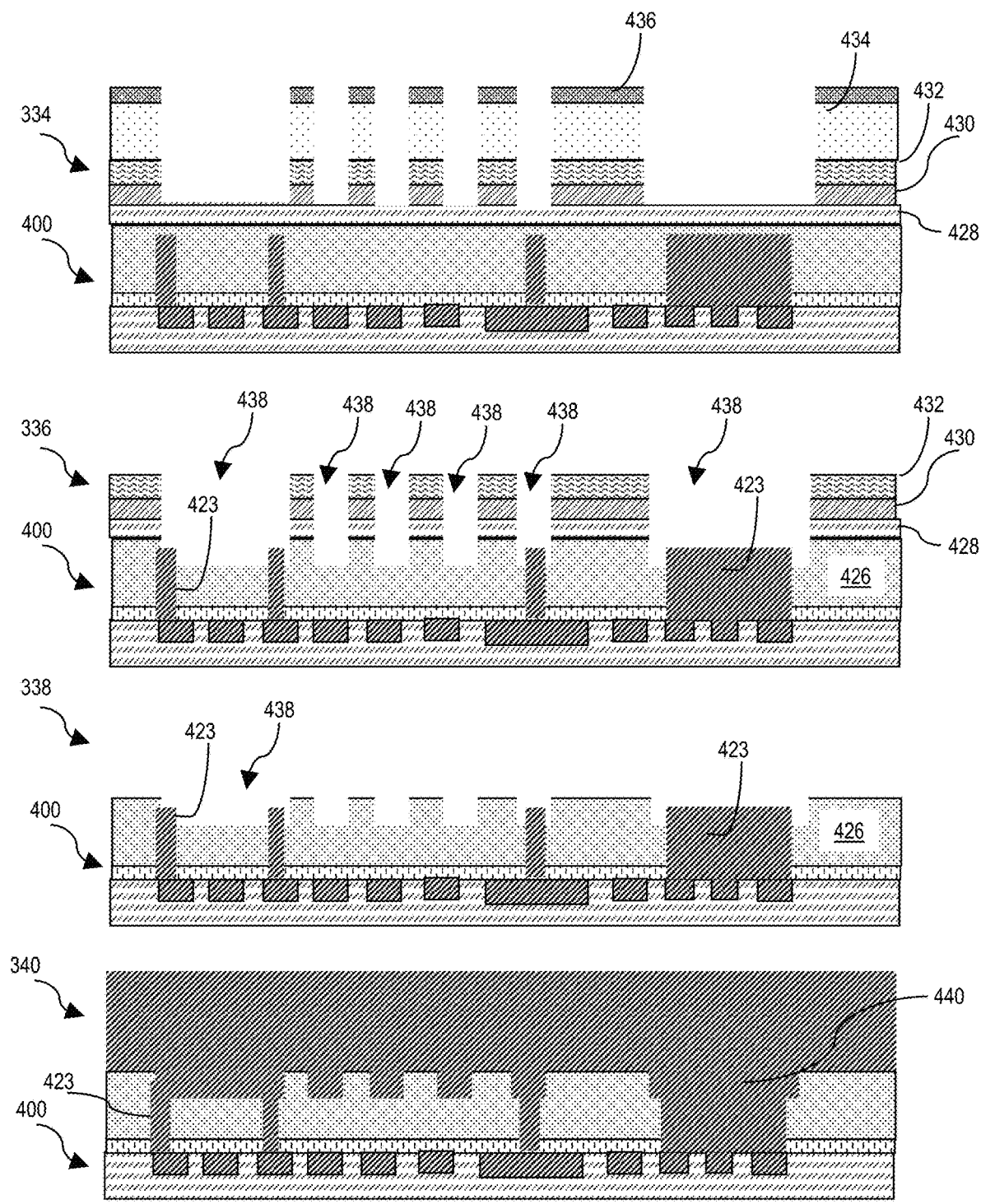

Referring to FIG. 4D, at 328, deposit a trench level ("Mx") stack of underlayer 428, TiN 430, and tetraethyl-orthosilicate (TEOS) 432. At 330, deposit Mx OPL 434 and SiARC 436 onto the TEOS 432, then at 332 unmask portions of the TEOS using the OPL 434 and the SiARC 436 mask. While etching TEOS 432, top Siarc 436 is removed As shown in FIG. 4E, at 334, etch unmasked portions of the OPL 434, the TEOS 432, and the TiN 430 using a $Cl_2$ base chemistry to open the TIN 430; then, at 335 (shown only in FIG. 3), strip the OPL 434. At 336, form trenches 438 that reveal the vias 423 by etching the underlayer 428 and layer 426 with a $CF_4$ base chemistry selective to TiN 410 and metallized Via 423. Top Oxide layer 432 is removed during that process. Note that some of the trenches 438 are in the plane of the drawing view whereas some others, which appear narrower, actually extend orthogonal to the plane of the drawing view. Not all of the trenches 438 connect to previously formed vias 423. At 338, underlayer 428, and TiN 430, are removed by wet process. Then at 340, form via bars 440, which connect the vias 423, by metallizing the trenches 438. In subsequent step 341 (shown only in FIG. 3), the structure can be prepared for deposition of additional layers by reducing and planarizing the metallizing layer using, e.g., chemical mechanical polishing.

Given the discussion thus far, it will be appreciated that, in general terms, a BEOL interconnect is improved by using lithography to define a via in a very short stack, which improves the overlay and the uniformity of the via critical dimension CD. The short stack via etching is achieved by using titanium nitride (TiN) as a hard mask until final metallization, then after a copper/oxide chemical mechanical polishing (CMP), removing the TiN by wet or dry process.

Thus, an exemplary method 300, according to an aspect of the invention, includes step 301 of depositing an Nblock layer onto a semiconductor substrate that includes metal deposits; step 302 of depositing a titanium nitride (TiN) layer directly onto the Nblock layer; step 304 of depositing an oxide layer directly onto the TiN layer; and step 310 of forming a partial-depth via hole through the oxide layer to contact the TiN layer, wherein the partial-depth via hole is aligned to one of the metal deposits in the substrate. In one or more embodiments, the method 300 also includes step 312 of forming a completed via hole by etching the TiN layer through the partial-depth via hole.

In one or more embodiments, the method 300 also includes, after depositing the oxide layer, a step 306 of depositing an organic planarization layer (OPL) directly onto the oxide layer and depositing a silicon anti-reflective coating (SiARC) directly onto the OPL; a step 309 of removing at least a portion of the OPL and the SiARC by etch after lithography; and then the step 310 of forming the depth via hole by etching the oxide layer through the removed portion of the OPL and the SiARC.

In one or more embodiments, the method 300 also includes, after forming the depth via hole, at step 312 stripping the OPL.

In one or more embodiments, step 310 of etching the oxide layer uses a CFx chemistry for dry process.

In one or more embodiments, step 312 of etching the TiN layer uses a chemistry selective to the oxide layer. For example, etching the TiN layer uses a $Cl_2$ dry process.

In one or more embodiments, the method 300 further includes a step 316 of depositing a metal layer into the via holes and onto remnants of the oxide layer.

In one or more embodiments, the method 300 further includes a step 318 of removing an upper portion of the metal layer by chemical mechanical polishing.

In one or more embodiments, the method 300 further includes a step 320 of removing the oxide layer by a dry etch process.

In one or more embodiments, the method 300 further includes a step 322 of removing the TiN using a wet chemistry.

In one or more embodiments, the method 300 further includes a step 324 of depositing a subsequent oxide layer over the metal layer in the via holes.

Accordingly, it will be apparent that the method 300 provides a semiconductor wafer 400 that includes an underlayer 408; metal deposits 406 in the underlayer; a sacrificial hardmask layer 404 that covers the underlayer and the metal deposits; a titanium nitride layer 402 that directly covers the sacrificial hardmask layer; an oxide layer 402 that directly covers the titanium nitride layer; and a partial-depth via hole 418 that is etched through the oxide layer to contact the titanium nitride layer that directly underlays the oxide layer, wherein the partial-depth via hole is aligned to one of the metal deposits in the underlayer.

In one or more embodiments, the semiconductor wafer 400 also includes a completed via hole 420 that is etched from the depth via hole through the titanium nitride layer to contact the metal deposit in the underlayer.

In one or more embodiments, the semiconductor wafer 400 also includes a metal via 423 that is deposited into the completed via hole and contacts the metal deposit in the underlayer. In one or more embodiments, the metal via has a substantially constant critical dimension.

Figure 5:
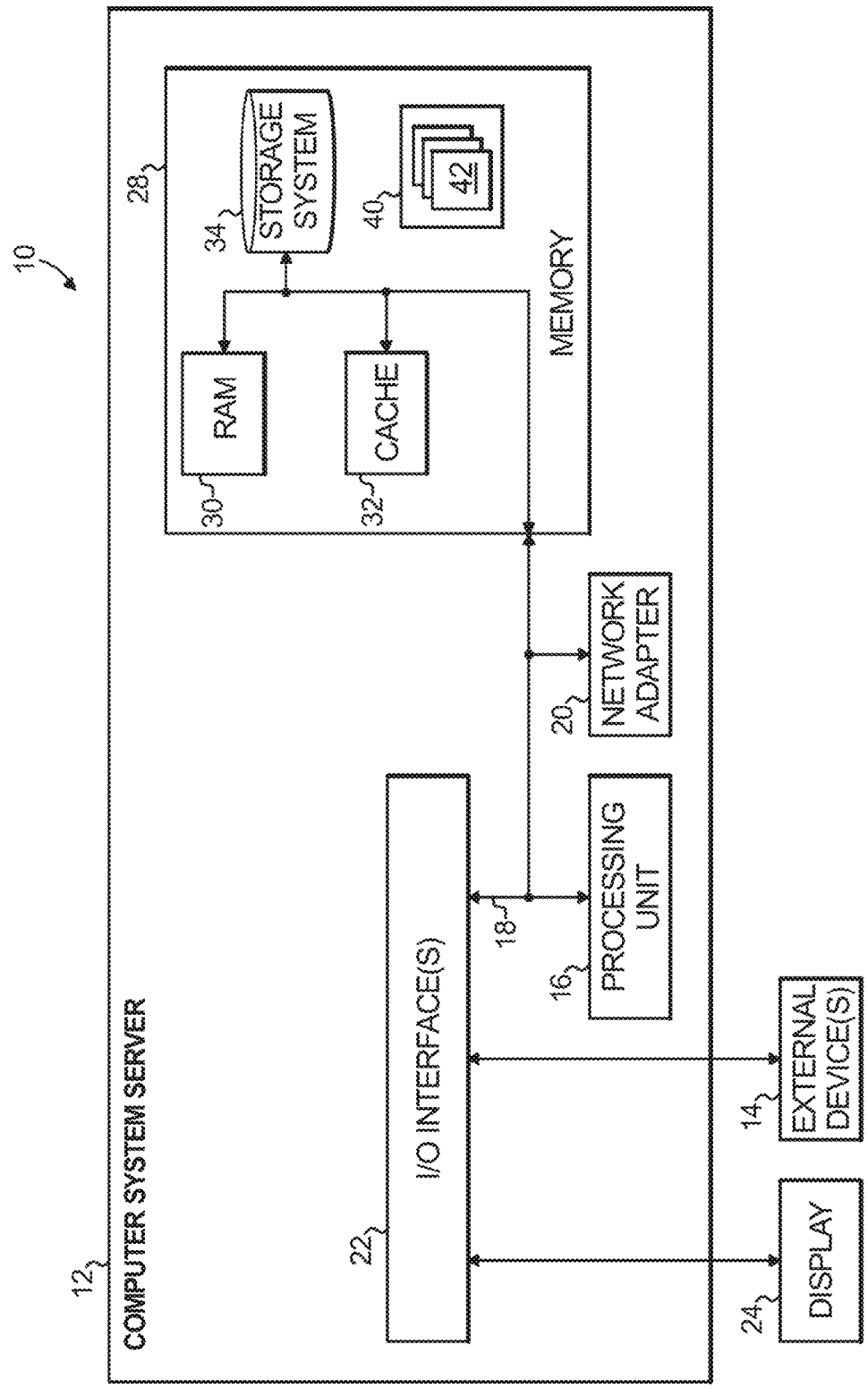
FIG. 5 depicts schematically an exemplary computer system for controlling semiconductor fabrication process equipment according to an exemplary embodiment.

One or more embodiments of the invention, or elements thereof, can be implemented in the form of an apparatus including a memory and at least one processor that is coupled to the memory and operative to perform exemplary method steps, or in the form of a non-transitory computer readable medium embodying computer executable instructions which when executed by a computer cause the computer to perform exemplary method steps. FIG. 5 depicts a computer system that may be useful in implementing one or more aspects and/or elements of the invention; for example, by controlling semiconductor process equipment to implement aspects of the invention by providing instructions over network adapter 20, discussed below.

In system 10 there is a computer server 12, which is operational with numerous other general purpose or special purpose computing system environments or configurations. Examples of well-known computing systems, environments, and/or configurations that may be suitable for use with computer server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer server 12 may be described in the general context of computer system executable instructions, such as program modules, being executed by a computer system. Generally, program modules may include routines, programs, objects, components, logic, data structures, and so on that perform particular tasks or implement particular abstract data types. Computer server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 5, computer server 12 in system 10 is shown in the form of a general-purpose computing device. The components of computer server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer server 12 typically includes a variety of computer system readable media. Such media may be any available media that is accessible by computer server 12, and it includes both volatile and non-volatile media, removable and non-removable media.

System memory 28 can include computer system readable media in the form of volatile memory, such as random access memory (RAM) 30 and/or cache memory 32. Computer server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer server 12 may also communicate with one or more external devices 14 such as semiconductor fabrication process equipment in accordance with aspects of the invention. Computer server 12 also may communicate with a display 24, etc.; one or more devices that enable a user to interact with computer server 12; and/or any devices (e.g., network card, modem, etc.) that enable computer server 12 to communicate with one or more other computing devices. Such communication can occur via Input/Output (I/O) interfaces 22. Still yet, computer server 12 can communicate with one or more networks such as a local area network (LAN), a general wide area network (WAN), and/or a public network (e.g., the Internet) via network adapter 20. As depicted, network adapter 20 communicates with the other components of computer server 12 via bus 18. It should be understood that although not shown, other hardware and/or software components could be used in conjunction with computer server 12. Examples include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 5, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 5) running a server program. It will be understood that such a physical server may or may not include a display and keyboard.

It should be noted that any of the methods described herein can include an additional step of providing a system comprising distinct software modules embodied on a computer readable storage medium. The method steps can then be carried out using the distinct software modules and/or sub-modules of the system, executing on one or more hardware processors such as 16. Further, a computer program product can include a computer-readable storage medium with code adapted to be implemented to carry out one or more method steps described herein, including the provision of the system with the distinct software modules.

The following description is applicable to controlling semiconductor process equipment with computer instructions.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    depositing an Nblock layer onto a semiconductor substrate that includes metal deposits;
    depositing a titanium nitride (TiN) layer directly onto the Nblock layer;
    depositing an oxide layer directly onto the TiN layer;
    forming a partial-depth via hole through the oxide layer to contact the TiN layer, wherein the partial-depth via hole is aligned to one of the metal deposits in the substrate;
    forming a completed via hole by etching the TiN layer through the partial-depth via hole; and
    depositing a metal layer into the completed via hole and onto remnants of the oxide layer.

2. The method of claim 1 further comprising:
    after depositing the oxide layer, depositing an organic planarization layer (OPL) directly onto the oxide layer and depositing a silicon anti-reflective coating (SiARC) directly onto the OPL;
    removing at least a portion of the OPL and the SiARC by etch after lithography; and
    forming the partial-depth via hole by etching the oxide layer through the removed portion of the OPL and the SiARC.

3. The method of claim 2, wherein the partial-depth via hole is formed while removing the silicon anti-reflective coating (SiARC).

4. The method of claim 2 further comprising:
    after forming the partial-depth via hole, stripping the OPL.

5. The method of claim 2 wherein:
etching the oxide layer uses a CFx chemistry for dry process.

6. The method of claim 5 wherein:
etching the TiN layer uses a dry process chemistry that is selective to the oxide layer.

7. The method of claim 6 wherein:
etching the TiN layer uses a $Cl_2$ dry process.

8. The method of claim 1 further comprising:
removing an upper portion of the metal layer by chemical mechanical polishing.

9. The method of claim 8 further comprising:
removing the oxide layer by a dry etch process.

10. The method of claim 9 further comprising:
removing the TiN using a wet chemistry.

11. A non-transitory computer readable medium embodying computer executable instructions which when executed by at least one processor causes the at least one processor to control process equipment to perform the method of:
depositing an Nblock layer onto a semiconductor substrate;
depositing a titanium nitride (TiN) layer directly onto the Nblock layer;
depositing an oxide layer directly onto the TiN layer;
forming partial-depth via holes through the oxide layer to contact the TiN layer;
forming completed via holes by etching the TiN layer through the partial-depth via holes; and
depositing a metal layer into the completed via holes and onto remnants of the oxide layer.

12. The medium of claim 11, the method further comprising:
after depositing the oxide layer, depositing an organic planarization layer (OPL) directly onto the oxide layer and depositing a silicon anti-reflective coating (SiARC) directly onto the OPL;
removing portions of the OPL and the SiARC by lithography; and
forming the partial-depth via holes by etching the oxide layer through the removed portions of the OPL and the SiARC.

13. The medium of claim 12 wherein:
etching the oxide layer uses a $CF_x$ dry process chemistry.

14. The medium of claim 13 wherein:
etching the TiN layer uses a dry process chemistry that is selective to the oxide layer.

* * * * *